United States Patent
Ozawa et al.

(10) Patent No.: US 6,215,182 B1
(45) Date of Patent: Apr. 10, 2001

(54) SEMICONDUCTOR DEVICE AND METHOD FOR PRODUCING THE SAME

(75) Inventors: Kaname Ozawa, Kawasaki; Hayato Okuda, Aizuwakamatsu; Ryuji Nomoto, Kawasaki; Yuji Akashi, Kasugai; Katsuro Hiraiwa, Kawasaki, all of (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/531,232

(22) Filed: Mar. 20, 2000

(30) Foreign Application Priority Data

Oct. 19, 1999 (JP) .................................................. 11-297410

(51) Int. Cl.[7] ........................... H01L 23/34; H01L 23/02; H01L 23/48
(52) U.S. Cl. ..................... 257/723; 174/52.4; 257/685; 257/686; 257/725; 257/758
(58) Field of Search .................................. 174/52.2–52.4; 257/685, 686, 723, 725, 758, 776

(56) References Cited

U.S. PATENT DOCUMENTS 5,422,435   6/1995  Takiar et al. ...................... 174/52.4
6,005,778 * 12/1999 Spielberger et al. ................ 361/770

FOREIGN PATENT DOCUMENTS 10-70232 * 3/1998 (JP) .

* cited by examiner

*Primary Examiner*—Eddie C. Lee
*Assistant Examiner*—Allan R. Wilson
(74) *Attorney, Agent, or Firm*—Armstrong, Westerman, Hattori, McLeland & Naughton, LLP

(57) ABSTRACT

A semiconductor device includes the first through third semiconductor devices which are stacked on a substrate and the first through third wires for connecting the semiconductor elements and the substrate. The first wires serve to connect electrodes of the first semiconductor element positioned uppermost and electrodes of the second semiconductor element. The second wires serve to connect the electrodes of the second semiconductor element and electrodes of the third semiconductor element. The third wires serve to connect the electrodes of the third semiconductor element and bonding pads of the substrate. Between the first wires and the electrodes of the second semiconductor element and between the second wires and the electrodes of the third semiconductor element, stud bumps are provided so as to form space therebetween, thereby avoiding short-circuits therebetween.

6 Claims, 14 Drawing Sheets

SEMICONDUCTOR DEVICE AND METHOD FOR PRODUCING THE SAME

BACKGROUND OF THE INVENTION

1. Field of the Invention

The present invention generally relates to semiconductor devices and methods for producing the same, and more particularly to a semiconductor device and a method for producing the semiconductor device, which is configured to have a plurality of semiconductor elements stacked therein.

In recent years, with increasing demand for miniaturized portable equipment such as a portable telephone, a semiconductor device, which is carried therein, has also been required to become smaller. In order to support this situation, a stack-type semiconductor device, which has a plurality of semiconductor elements stacked within resin for encapsulation (a package) thereof, is developed.

2. Description of the Related Art

FIGS. 1 and 2 show a conventional stack-type semiconductor device 1A which comprises a plurality of leads 5 serving as connecting terminals. FIG. 1 is a cross-sectional view of the semiconductor device 1A and FIG. 2 is plan view of the semiconductor device 1A where encapsulating resin 6A is partly removed.

The semiconductor device 1A shown in FIGS. 1 and 2 is configured to have three semiconductor elements 2, 3 and 4 which are stacked on a stage portion 5a provided on the leads 5. On the semiconductor elements 2, 3 and 4, there are respectively provided first electrodes 7, second electrodes 8 and third electrodes 9, which are connected to bonding-pads 5c of the leads 5 via first wires 10, second wires 11 and third wires 12, respectively. Also, outer leads 5b of the leads 5 are formed extending to the outside thereof, for example, like a gull wing.

Since the semiconductor device 1A shown in FIGS. 1 and 2 is configured such that the outer leads 5b extend out of the encapsulating resin 6A and the bonding-pads 5c to which the wires 10 through 12 are joined are formed outside the semiconductor elements 2 through 4, this results in a large size of the semiconductor device 1A. Further, although the semiconductor device 1A has a multi-pin structure resulting from the high-density and stack of the semiconductor elements 2 through 4, there is a limit to shortening pitches of the adjacent leads 5 and this also results in the large size of the semiconductor device 1A.

On the other hand, FIGS. 3 and 4 show a conventional BGA-type (ball grid array type) semiconductor device 1B which has a plurality of solder balls 15 serving as connecting terminals. FIG. 3 is a cross-sectional view of the semiconductor device 1B and FIG. 4 is a plan view of the semiconductor device 1B where the encapsulating resin 6B is partly removed. In addition, in FIGS. 3 and 4, parts, which are the same as those shown in FIGS. 1 and 2, are given the same reference numerals.

The BGA-type semiconductor device 1B is configured to have first, second and third semiconductor elements 2, 3 and 4 which are stacked on a substrate 13 thereof, for example, a printed wiring substrate. On the semiconductor elements 2, 3 and 4, there are respectively provided electrodes 7, 8 and 9. These electrodes 7 through 9, using first, second and third wires 10, 11 and 12 respectively, are connected to a plurality of bonding pads 14 which is formed on the substrate 13 where the semiconductor elements 2 through 4 are stacked. The plurality of bonding pads 14 are connected to the respective solder balls 15 via through-holes and wires (both not shown). Thus, each of the semiconductor elements 2, 3 and 4 is connected to the solder balls 15 via the wires 10 through 12, the bonding pads 14, the not-shown through-holes and wires.

As previously described, since the BGA-type semiconductor device 1B is configured such that the solder balls 15 serving as connecting terminals are provided under the stacked semiconductor elements 2 through 4, it can be produced smaller in size than the semiconductor device 1A of FIGS. 1 and 2. Further, since the adjacent pitches of the bonding pads 14 can be designed narrower than those of the leads 5 shown in FIGS. 1 and 2, the bonding pads 14 can support the multi-pin structure.

As can be seen from FIGS. 1 through 4, however, either in the semiconductor devices 1A or 1B, since the leads 5 or the bonding pads 14 are connected to the semiconductor elements 2, 3 and 4 by using the wires 10, 11 and 12, it is imperative that the wires 10, 11 and 12 be laid within the encapsulating resin 6A or 6B.

Particularly, in the semiconductor device 1A or 1B where the semiconductor elements 2 through 4 are stacked, the first wires 10 need to be laid long enough so that the uppermost-positioned semiconductor element 2 can be connected to the leads 5 or the bonding pads 14. Thereby loop heights of the first wires 10 (heights from the leads 5 or the bonding pads 14 to the first wires 10) become high and this results in a large size (particularly, in height) of the semiconductor device 1A or 1B.

In order to solve the above mentioned problems and miniaturize the semiconductor devices 1A and 1B, it is necessary to lower the wires 10 through 12. Lowering the wires 10 through 12, however, brings about a problem that wires 10 through 12 may contact corner portions of the semiconductor elements 2 through 4, or adjacent wires thereof may contact each other to generate a short-circuit. As a result, reliability of the semiconductor device 1A or 1B is degraded.

SUMMARY OF THE INVENTION

It is a general object of the present invention to provide a semiconductor device and a method for producing the same, in which the above disadvantages are eliminated.

Another and a more specific object of the present invention is to provide a semiconductor device comprising:

a plurality of semiconductor elements, at least including an uppermost one, a middle one, and a lowermost one, which are stacked on a substrate;

a plurality of wires, each being electrically connected between two of electrodes, respectively provided on two adjacent ones of the plurality of semiconductor elements, or between two ones of electrodes, respectively provided on said substrate and said lowermost semiconductor element which is directly stacked on said substrate; and a plurality of spacer members, respectively provided between said wires and said electrodes provided on the semiconductor elements other than said uppermost one; wherein space is formed between said wires and the plurality of semiconductor elements by said spacer members, without contact therebetween.

Still another object of the present invention is to provide a method for producing a semiconductor device, comprising the steps of:

(a) stacking a plurality of semiconductor elements, at least including an uppermost one, a middle one, and a lowermost one, on a substrate; and (b) performing a wire bonding process in which a plurality of wires are each electrically connected between two of electrodes, respectively provided on two adjacent ones of the plurality of semiconductor elements, or between two electrodes, respectively provided on said substrate and said lowermost semiconductor element which is directly stacked on said substrate; wherein said wire bonding process comprises:

(c) performing a spacer-member arranging process in which a plurality of spacer members are provided between said wires and said electrodes provided on the semiconductor elements other than said uppermost one; and (d) performing a junction process in which said wires are respectively joined to said spacer members formed by said spacer-member arranging process.

Other objects, features and advantages of the present invention will become more apparent from the following detailed description when read in conjunction with the accompanying drawings.

DETAILED DESCRIPTION OF THE PREFERRED EMBODIMENTS

With reference to the drawings, a description will be given below of preferred embodiments of the present invention.

Figure 5:
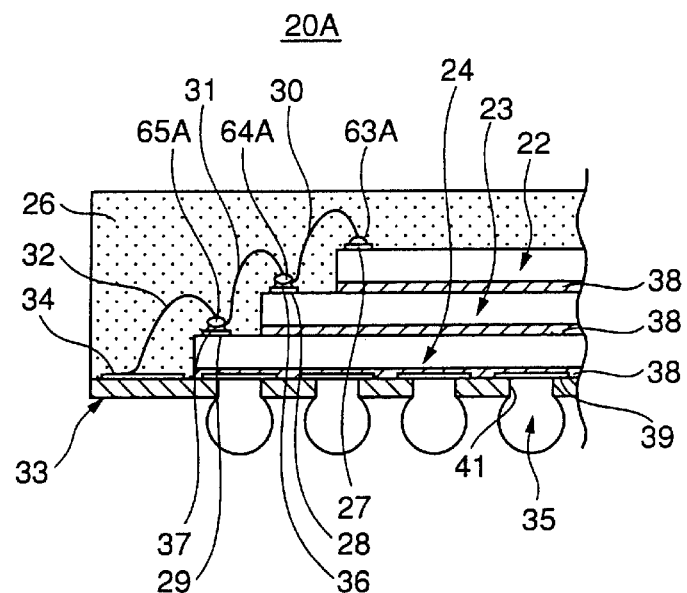
FIG. 5 is a cross-sectional view of a semiconductor device of a first embodiment according to the present invention.
Figure 6:
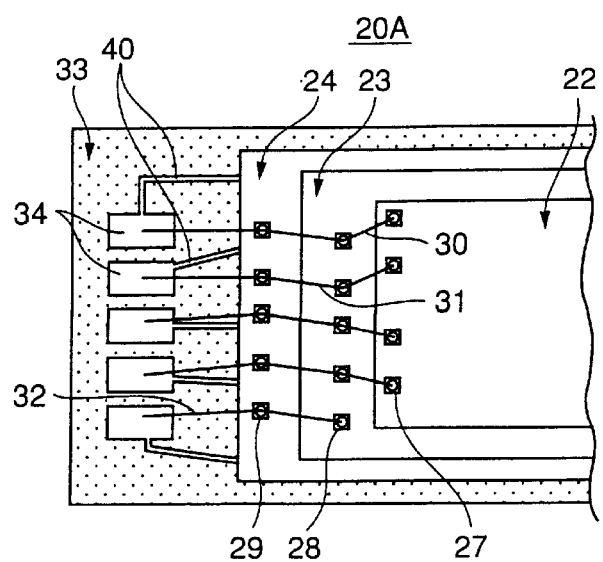
FIG. 6 is a plan view of the semiconductor device shown FIG. 5, where encapsulating resin is partly removed.
Figure 7:
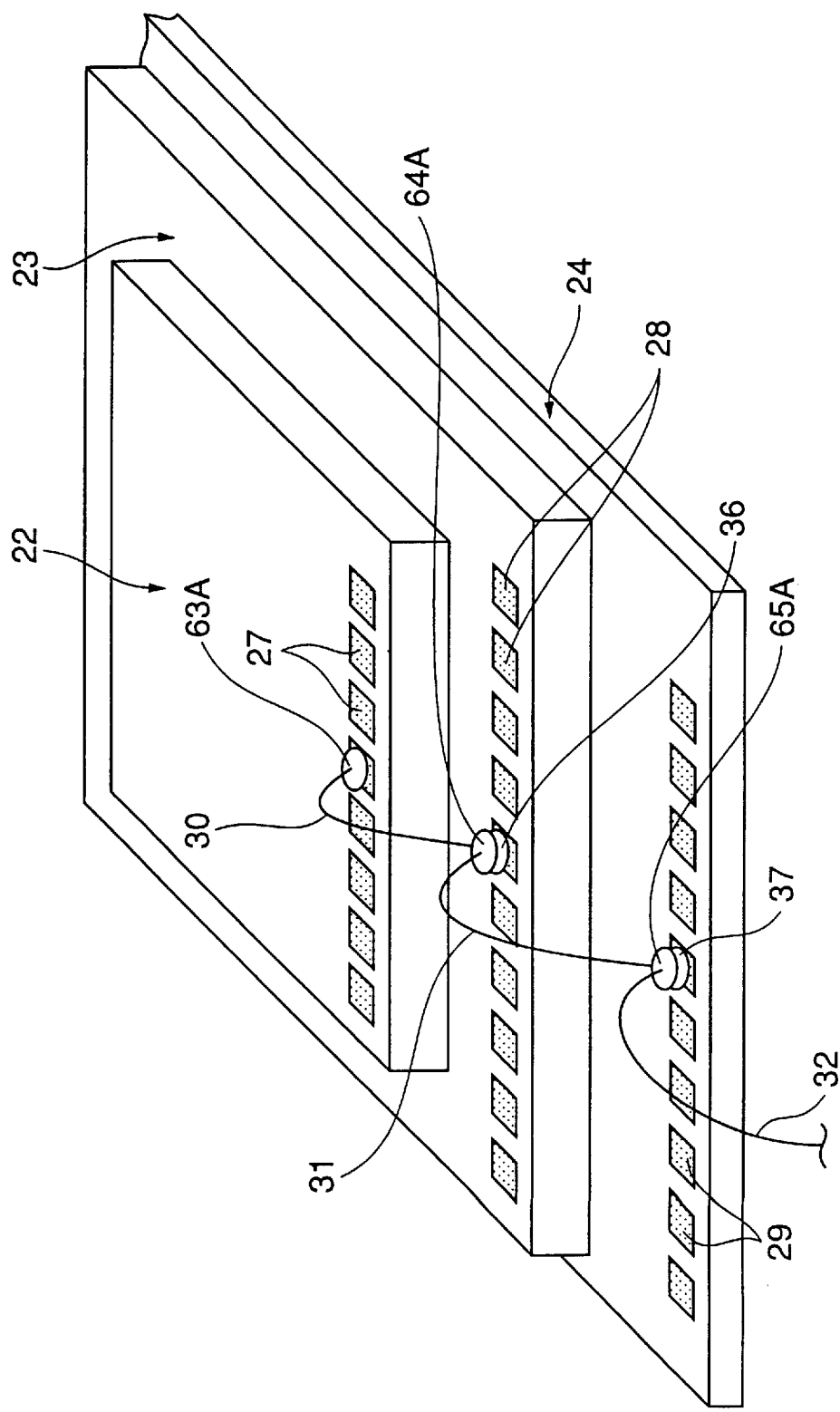
FIG. 7 is a diagram illustrating a wire connecting structure of the semiconductor device of the first embodiment according to the present invention.

FIGS. 5 through 7 are diagrams for illustrating a semiconductor device 20A according to a first embodiment of the present invention. FIG. 5 is a cross-sectional view showing the semiconductor device 20A. FIG. 6 is a plan view showing the semiconductor device 20A where encapsulating resin 6A is partly removed. FIG. 7 is a perspective view illustrating a wire connecting structure of the semiconductor device 20A.

The semiconductor device 20A of the present invention is a BGA (ball grid array) type semiconductor device, which comprises a plurality of semiconductor elements 22 through 24 (three in this embodiment), encapsulating resin 26, first through third wires 30 through 32, a substrate 33, and a plurality of solder balls 35.

The first, second and third semiconductor elements 22, 23 and 24 are configured to be stacked on the substrate 33. Specifically, between the first semiconductor element 22 and the second semiconductor element 23, between the second semiconductor element 23 and the third semiconductor element 24, and between the third semiconductor element 24 and the substrate 33, filmy insulation adhesive 38 is introduced. The semiconductor elements 22 through 24 and the substrate 33 are thus configured to adhere to each other by the insulation adhesive 38. In this embodiment, since the insulation adhesive 38 is filmy adhesive, its thickness is uniform and very thin.

Also, in a state of being stacked together, the first, second and third semiconductor elements 22, 23 and 24 are configured such that at least one peripheral side of each of the semiconductor elements 22, 23 and 24 is stepped so that they are stacked like stairs. As shown in FIG. 7, first, second and third electrodes 27, 28 and 29 are provided in predetermined positions on peripheries of the semiconductor elements 22, 23 and 24, respectively. Accordingly, the second electrodes 28 provided on the second semiconductor element 23 are positioned on a stepped portion formed by the first semiconductor element 22 and the second semiconductor element 23, and the third electrodes 29 provided on the third semiconductor element 24 are positioned on a stepped portion formed by the second semiconductor element 23 and the third semiconductor element 24.

The substrate 33 may be, for example, a flexible wiring substrate made of polyimide, or a printed wiring substrate made of glass epoxy. On a surface of the substrate 33, which surface (hereinafter referred as to an upper surface) the semiconductor elements 22 through 24 are carried on, there are provided a plurality of bonding pads 34, a plurality of ball-connecting pads 39, and a plurality of wires 40.

As shown in FIG. 6, the plurality of bonding pads 34 are formed on a periphery of a place, where the semiconductor elements 22 through 24 are carried, and as will be described later are respectively bonded by a plurality of the third wires 32. Also, the ball-connecting pads 39 are provided on a place where the solder balls 35 are formed. In this embodiment, the solder balls 35 are arranged in an area-array state. Accordingly, the solder balls 35 are provided under the stacked semiconductor elements 22 through 24.

Facing toward the plurality of ball-connecting pad 39, a plurality of holes 41 are formed as shown in FIG. 5. The solder balls 35 serving as the connecting terminals are joined to the ball-connecting pads via the holes 41 in the substrate 33. Also, the wires 40 are laid in a predetermined pattern so as to connecting the bonding pads 34 to the respective ball-connecting pads 39.

As previously described, since the ball-connecting pads 39 are positioned under the surface where the semiconductor elements 22 through 24 are carried, the wires 40 are laid extending from the bonding pads 34 toward the inside and such a structure may be called a fun-in structure. Accordingly, the bonding pads 34 are electrically connected to the solder balls 35 via the wires 40 and the ball-connecting pads 39, respectively.

The encapsulating resin 26 may be, for example, epoxy resin and is designed to be able to encapsulate the semiconductor elements 22 through 24 and the wires 30 through 32 therewithin. In this embodiment, the semiconductor device 20A is produced such that a substrate (hereinafter referred to as basic substrate) which is wider than the substrate 33 of the semiconductor device 20A is prepared, then a plurality of sets of the semiconductor elements 22 through 24 are stacked on the basic substrate, and after a wire bonding process is performed, the plurality of groups of the semiconductor elements 22 through 24 and the wires 30 through 32 are molded together and then a dicing process is used so that the basic substrate is diced into individual semiconductor devices 20A. Accordingly, productivity in fabricating the semiconductor device 20A can be improved.

Next, a description is given below of the first, the second and the third wires 30, 31 and 32.

Each of the wires 30 through 32 may be fine conductive lines made of a metal material such as copper or the like, and be laid by using a wire bonding device. The first wires 30 are laid between the second electrodes 28 provided on the second semiconductor element 23 and the first electrodes 27 provided on the first semiconductor element 22 which is directly stacked on the second semiconductor element 23. Also, each of the wires 30 through 32 is laid between electrodes, which have identical electrical characteristics and signal characteristics, namely, equi-characteristic electrodes.

Specifically, the second wires 31 are laid between the third electrodes 29 provided on the third semiconductor element 24 and the second electrodes 28 provided on the second semiconductor element 23 which is directly stacked on the third semiconductor element 24. Further, the third wires 32 are laid between the bonding pads 34 provided on the substrate 33 and the third electrodes 29 provided on the third semiconductor element 24 which is directly stacked on the substrate 33.

In addition, the meaning of ". . . directly stacked on . . . " is that ". . . stacked immediately on an upper portion of . . . ". But this does not means that the insulation adhesive 38 is not introduced therebetween. Accordingly, for example, a semiconductor element, which is directly stacked on the third semiconductor element 24, is the second semiconductor element 23, not including the first semiconductor element 22.

When laid as previously described, the first to the third wires 30 through 32 are connected to the substrate 33 via relays of the stacked semiconductor elements 24 and 23. As shown in FIGS. 5 and 7, they are thus laid step by step from the uppermost first semiconductor element 22 to the substrate 33.

In this embodiment, since the first to the third wires 30 through 32 are connected to the substrate 33 via relays of the stacked semiconductor elements 24 and 23, the lengths of each of the wires 30 through 32 can be shortened and thereby heights of wire loops thereof (distances from positions of second bonding of the wires to tops of the wire loops) can also be lowered. Accordingly, space for the wire loops within the semiconductor device 20A can be designed smaller, and thereby the miniaturization (in height) of the semiconductor device 20A can be achieved.

Also, in the embodiment, only one of the wires 32 is coupled to a corresponding one of the bonding pads 34 provided on the substrate 33. For this reason, each of the bonding pads 34 can be made smaller compared to the conventional bonding pads 14 (see FIGS. 3 and 4), to each of which the plurality of wires 10 through 12 is coupled. As a result, the semiconductor device 20A of the present invention can be miniaturized.

Next, a description is given below of a method for producing the semiconductor device 20A previously described.

In addition, since the method of this embodiment is featured in a wire bonding process which serves to lay the first, the second and the third wires 30 through 32, and is the same as conventional ones in other processes, a description of only the wire bonding process is given below.

FIGS. 8 through 12 are diagrams illustrating a sequence of the wire bonding process for laying the first, the second and the third wires 30 through 32.

Figure 8:
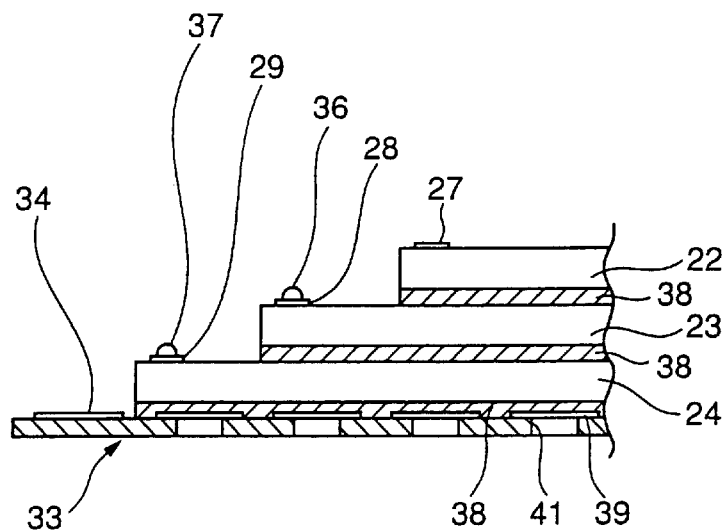
FIG. 8 is a diagram illustrating a bonding process in a method for producing the semiconductor device of the first embodiment according to the present invention.

FIG. 8 shows a state prior to the wiring bonding process of the wires 30 through 32. As shown in this diagram, the first to the third semiconductor elements 22 through 24 are stacked in advance on the substrate 33. In this embodiment, a stud-bump forming process, which is equivalent to a spacer-member arranging process in claim 6, is performed for the wires 30 through 32 prior to the wiring bonding process.

In the stud-bump forming process, first stud bumps 36 are formed on the second electrodes 28 provided on the second semiconductor element 23, and at the same time second stud bumps 37 are formed on the third electrodes 29 provided on the third semiconductor element 24. In this embodiment, stud bumps are not provided on the first electrodes 27.

The first and the second stud bumps 36 and 37, as will be described later, serve as spacer members, and are formed by using the wire bonding device also used for wire-bonding the first through the third wires 30 through 32. In addition, the stud bumps 36 and 37 may be made of a material the same as that of the wires 30 through 32.

Thus, one wire bonding device can lay both the stud bumps 36, 37 and wires 30 through 32. Accordingly, there is no need to use additional equipment to form the stud bumps 36 and 37 and thereby the cost thereof can be saved.

Figure 9:
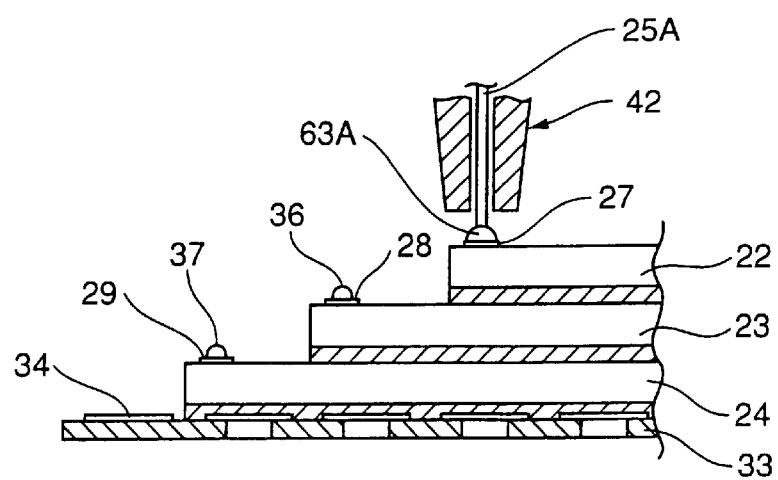
FIG. 9 is a diagram illustrating another bonding process in the method for producing the semiconductor device of the first embodiment according to the present invention.

FIG. 9 shows a state in which a fine metal line 25A is joined to the first electrode 27 provided on the first semiconductor element 22 (first bonding). The wires 30 through 32 are laid by using a capillary 42 which is provided in the wire bonding device.

The capillary 42 has a hole formed in the center thereof through which the fine metal line 25A can pass. The fine metal line 25A is coupled to the electrode 27 by using the capillary 42 such that part of the fine metal line 25A is extended out of the capillary 42 so as to form a ball portion on the extended part by a spark discharge or the like, and then the ball portion is pressed upon the electrode 27 while the capillary 42 is ultrasonically vibrated. Thus, the fine metal line 25A is ultrasonically welded on the electrode 27.

As previously described, during the first bonding of the fine metal line 25A, the ball portion formed on the end of the fine metal line 25A is joined to the electrode 27, and such a junction is called a nail head bonding. In a description to be given below, a junction portion between the fine metal line 25A and the electrode 27 is called a first nail head bonding (hereinafter referred to as NHB) portion 63A.

When the fine metal line 25A is joined to the first electrode 27, the capillary 42 pushes the fine metal line 25A out and moves it to a place where the second electrode 28 of the second semiconductor element 23 is formed. Then, the capillary 42 presses the fine metal line 25A upon the first stud bump 36 formed on the second electrode 28 so as to perform an ultrasonic welding by the ultrasonic vibration (second bonding).

Figure 10:
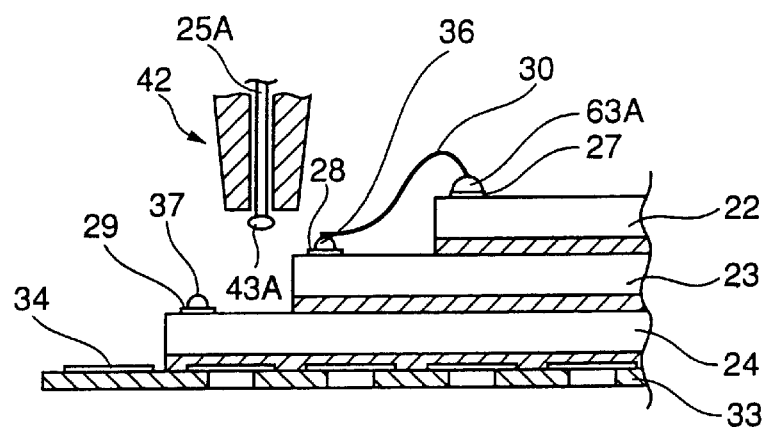
FIG. 10 is a diagram illustrating still another bonding process in the method for producing the semiconductor device of the first embodiment according to the present invention.

Thus, as shown in FIG. 10, one of the first wires 30 is laid between one of the first electrodes 27 and one of the second electrodes 28. At this time, although the first stud bump 36 is somewhat deformed due to being pressed by the capillary 42, a predetermined height D1 is maintained as shown by arrows in FIG. 13.

In this embodiment as previously described, a second bonding side of the first wire 30 is joined to the first stud bump 36. The first stud bump 36 is made of a material (conductive material) the same as that of wires 30 through 32.

For this reason, in a state of the second bonding side of the first wire 30 being joined to the stud bump 36, the first wire 30 becomes electrically connected with the second electrode 28. Also, FIG. 10 shows a state in which a ball portion 43A is formed on the end portion of the fine metal line 25A so as to form the second wire 31.

As previously described, when laying of the first wire 30 is completed, laying of the second wire 31 begins. The second wire 31 is laid such that the capillary 42 is moved to a place where the first stud bump 36 is formed, and then the ball portion 43A is pressed upon the first stud bump 36 and at the same time, the capillary 42 is ultrasonically vibrated.

Figure 11:
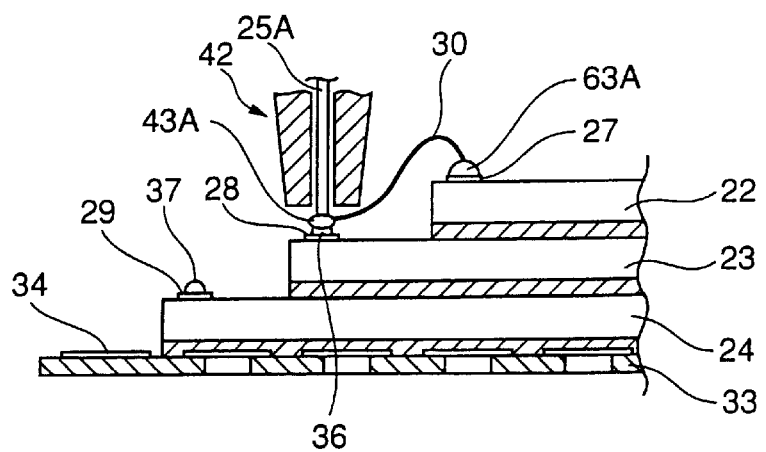
FIG. 11 is a diagram illustrating still another bonding process in the method for producing the semiconductor device of the first embodiment according to the present invention.

Thus, as shown in FIG. 11, the fine metal line 25A is ultrasonically welded on the first stud bump 36. Since the welding of the fine metal line 25A becomes the first bonding, a second NHB portion 64A is formed on the first stud bump 36.

After the fine metal line 25A is joined to the first stud bump 36, the capillary 42 pushes the fine metal line 25A out and moves it to a place where the third electrode 29 of the third semiconductor element 24 is formed. Next, the capillary 42 presses the fine metal line 25A upon the second stud bump 37 formed on the third electrode 29 so as to perform the ultrasonic vibration (the second bonding).

Figure 12:
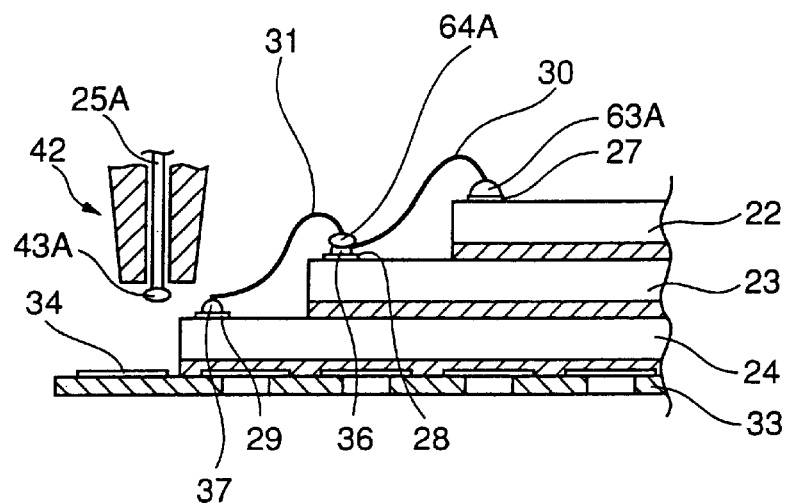
FIG. 12 is a diagram illustrating still another bonding process in the method for producing the semiconductor device of the first embodiment according to the present invention.

Thus, as shown in FIG. 12, the second wire 31 is laid between the second electrode 28 and the third electrode 29. At this time, although the second stud bump 37 is somewhat deformed due to being pressed by the capillary 42, the predetermined height D1 is maintained as shown by an arrow in FIG. 13. Further, since the second stud bump 37 is also made of the same conductive material, in a state of the second bonding side of the second wire 31 being joined to the stud bump 37, the second wire 31 becomes electrically connected with the third electrode 29.

Similarly, by performing the same process as previously described, the third wire 32 is laid between the third electrode 29 and the bonding pad 34 of the substrate 33. On the bonding pad 34, however, there is no stud bump formed.

By performing the wire bonding process previously described, the wires 30 through 32 can be connected to the substrate 33 via the relays of the semiconductor elements 24 and 23, and thereby they are laid step by step from the first semiconductor element 22 to the substrate 33. According to such a configuration, the wires 30 through 32 can be shortened and the loop heights thereof can be lowered.

Figure 1:
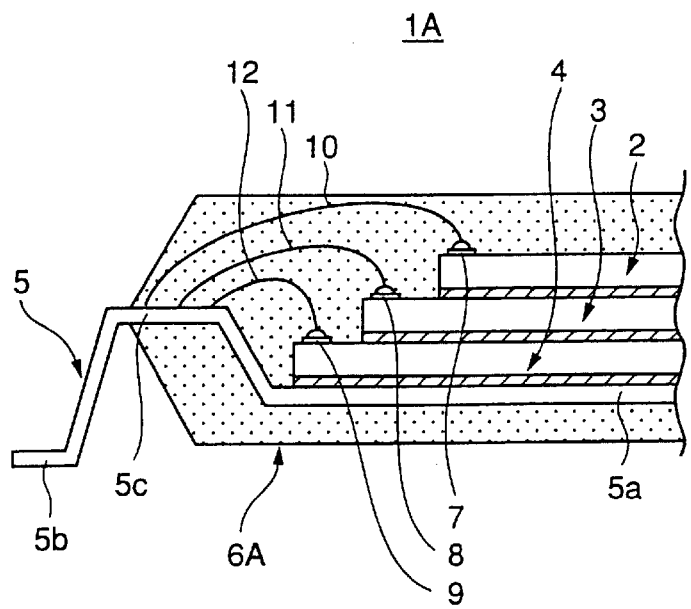
FIG. 1 is a cross-sectional view of a conventional semiconductor device.
Figure 2:
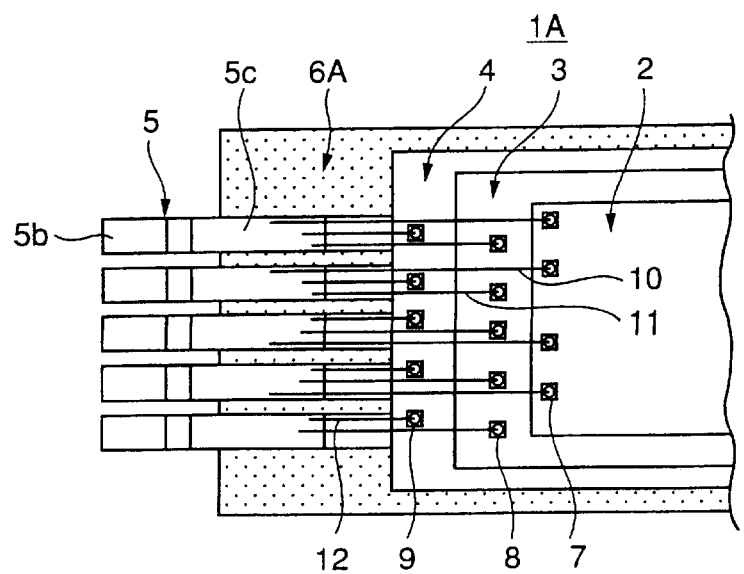
FIG. 2 is a plan view of the conventional semiconductor device shown in FIG. 1, where encapsulating resin is partly removed.
Figure 3:
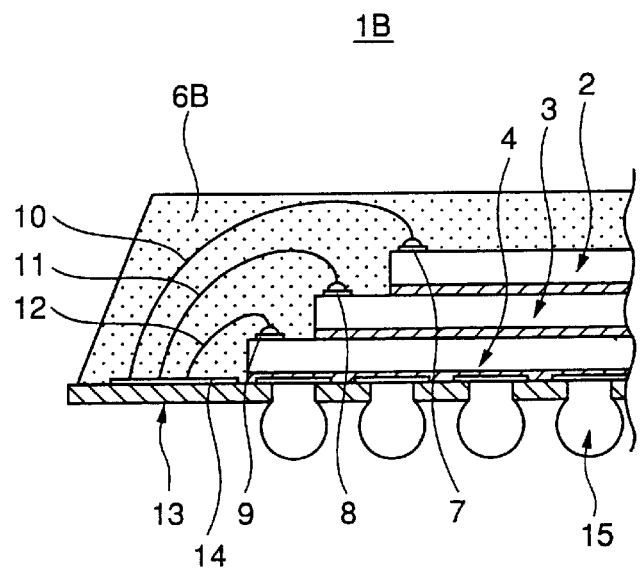
FIG. 3 is a cross-sectional view of another conventional semiconductor device.
Figure 4:
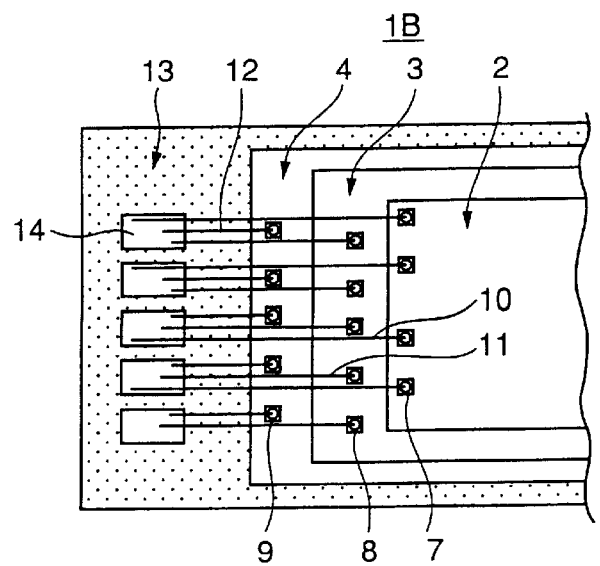
FIG. 4 is a plan view of the conventional semiconductor device shown FIG. 3, where encapsulating resin is partly removed.

When the wires 30 through 32 are shortened, inductance thereof is reduced and thereby the electrical characteristics (particularly high-frequency characteristics) of the semiconductor device 20A can be improved. In addition, conventionally as shown in FIG. 3, the electrodes 7 through 9 of the semiconductor elements 2 through 4 are directly connected to the bonding pads 14, and this brings about a problem that the bonding pads 14 are congested with the wires 10 through 12. As a result, the adjacent wires may contact each other and the bonding pads 14 become large.

In contrast, according to this embodiment, the electrodes of the first and second semiconductor elements 22 and 23 are not directly connected to the bonding pads 34 and thereby the number of the wires is not increased even in a connection place near to the substrate 33. Hence, the adjacent wires can avoid contacting with each other and the miniaturization of the bonding pads 34, which contributes to the miniaturization of the semiconductor device 20A, can be achieved.

Figure 14:
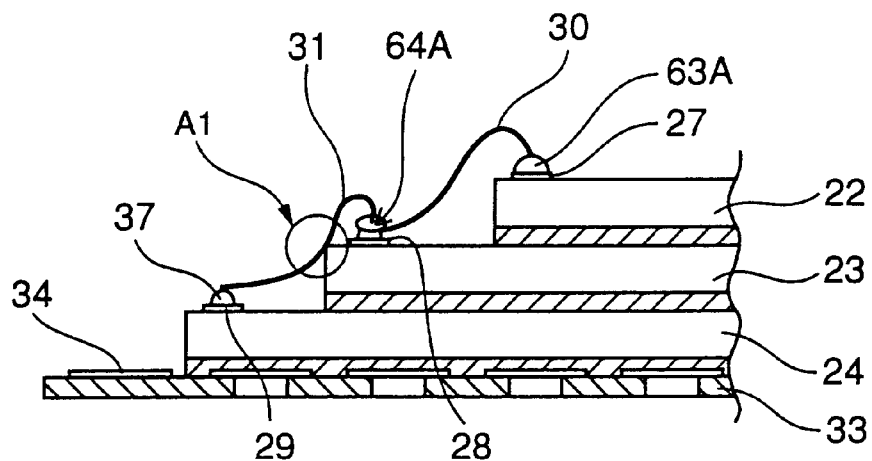
FIG. 14 is a diagram illustrating a problem generated when wires are directly bonded to electrodes of the semiconductor device of the first embodiment according to the present invention.

Further, by lowering the loop heights of the wires 30 through 32, the miniaturization (in height) of the semiconductor device 20A can be realized. In the case of lowering the loop heights of the wires 30 through 32, however, the wires 30 through 32 may contact the corner portions of the semiconductor elements 22 through 24 as shown by an arrow A1 in FIG. 14, and this may result in a short circuit.

In this embodiment, however, the first stud bump 36 is mounted between the second NHB portion 64A and the second electrode 28 and the second stud bump 37 is mounted between the third NHB portion 65A and the third electrode 29. Thereby, the wires 30 through 32 can avoid contacting the corner portions of the semiconductor elements 22 through 24.

Figure 13:
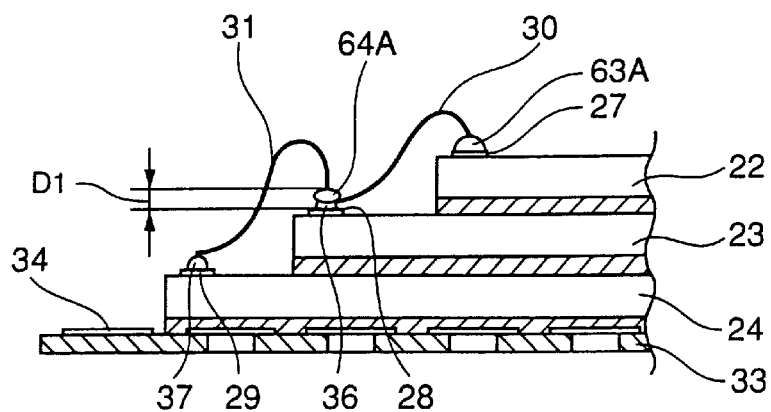
FIG. 13 is a diagram illustrating effects of the semiconductor device of the first embodiment according to the present invention.

Next, with reference to FIG. 13, a description is given below in respect of effects of the first and second stud bumps 36 and 37. Because the effects of the first stud bump 36 is the same as that of the second stud bump 37, the description is given only for the first stud bump 36.

The first stud bump 36 is sandwiched between the second electrode 28 and the second NHB portion 64A, where the second bonding of the first wire 30 is performed. As previously described, since the first stud bump 36 has the height D1, the second NHB portion 64A is separated from the second electrode 28 by the predetermined measure D1. That is, the first stud bump 36 serves as the spacer member for separating the second NHB portion 64A from the second electrode 28.

On the other hand, in order to avoid having the wires 30 through 32 contacting the semiconductor elements 22 through 24, it is necessary to form a space therebetween. As described in this embodiment, by providing the first stud bump 36 therebetween, the second bonding position of the first wire 30 is separated from the second electrode 28, and thereby the first wire 30 is separated from the corner of the first semiconductor element 22.

Also, by providing the first stud bump 36, the second NHB portion 64A is separated from the second electrode 28 and the second wire 31 is separated from the corner of the second semiconductor element 23. Further, in the second bonding position of the second wire 31, the second stud bump 37 is provided and thereby the second wire 31 is separated from the corner of the second semiconductor element 23.

Accordingly, by providing the first and second stud bumps 36 and 37, the contact of the wires 30 through 32 with the semiconductor elements 22 through 24 can be prevented. As a result, a short circuit does not occur between the wires 30 through 32 and circuits formed in the semiconductor elements 22 through 24, and thereby the reliability of the semiconductor device 20A can be improved.

Also, distances between the wires 30 through 32 and the semiconductor elements 22 through 24 can be adjusted by adjusting the heights of the first and second stud bumps 36 and 37. It is desirable to set these heights at least as high as required to provide space between the wires 30 through 32 and the semiconductor elements 22 through 24.

That is, it would be better for the stud bumps 36 and 37 to be made higher in terms of preventing the wires 30 through 32 from contacting the semiconductor elements 22 through 24. If the stud bumps 36 and 37 are made too high, however, the loop heights of the wires 30 through 32 become higher and this results in a large size of the semiconductor device 20A.

Accordingly, by properly designing the heights of the stud bumps 36 and 37 equal to the minimum height required to form the space between the wires 30 through 32 and the semiconductor elements 22 through 24, the miniaturization and high reliability of the semiconductor device 20A can both be achieved.

Next, a description will be given below with respect to a second embodiment of the present invention.

Figure 15:
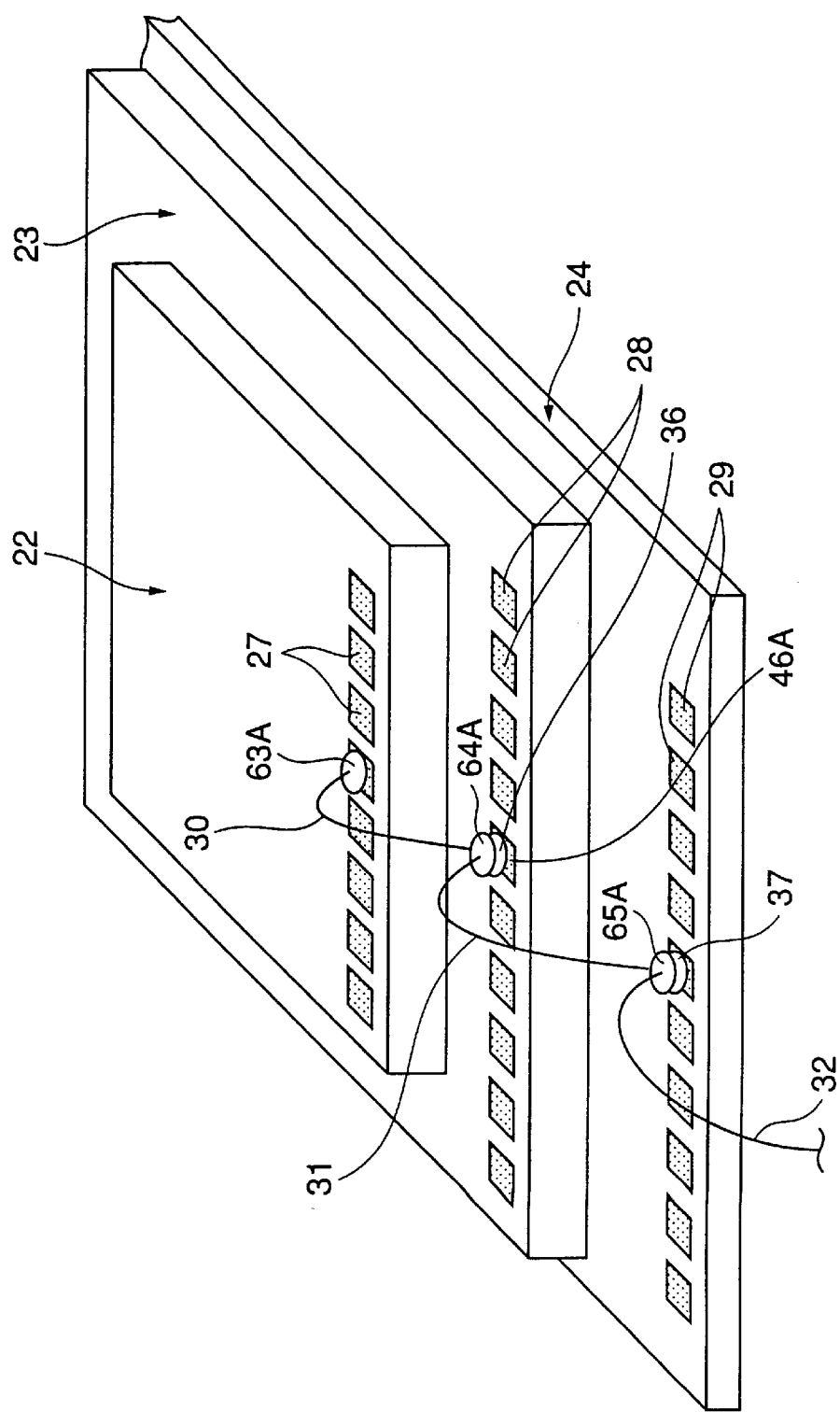
FIG. 15 is a diagram illustrating a wire connecting structure of a semiconductor device of a second embodiment according to the present invention.

FIG. 15 is a diagram illustrating a wire connecting structure of a semiconductor device of the second embodiment.

In addition, in FIG. 15 and other diagrams to be used later, parts, which are the same as those in FIGS. 5 through 13 used for the first embodiment, are given the same reference numerals and a description thereof is omitted.

The semiconductor device of the second embodiment is featured in that dummy pads 46A which are provided on the semiconductor elements 22 through 24 serve as a relay portion for the wires 30 through 32. The dummy pads 46A are electrically not connected with circuits formed within the semiconductor elements 22 through 24.

Also, the dummy pads 46A, which are provided on places where the electrodes 27 through 29 are located, have sizes equal to or broader than the electrodes 27 through 29. The dummy pads 46A provide sufficient space for the wires to be connected thereto.

As shown in FIG. 15, in this embodiment, only one dummy pad 46A is provided on the second semiconductor element 23. Usually, each of the semiconductor elements 22 through 24 is provided with a plurality of the dummy pads 46A.

As previously described, since the dummy pad 46A is electrically not connected with circuits formed within the semiconductor element 23, the dummy pad 46A can be connected to the wires 30 and 31 without considering electrical properties. That is, in a case of connecting a pair of semiconductor elements (for example, the first and second semiconductor elements 22 and 23) by using the first wire 30, the electrodes 27 and 28 that are connected together are required to have identical electrical properties. However, the dummy pad 46A is not connected with the circuits of the semiconductor element 23 and therefore the properties of the dummy pad 46A need not to be considered.

In this configuration, the dummy pads 46A provided on the semiconductor elements 22 through 24 can serve as relay portions for relaying the wires 30 through 32. That is, the dummy pads 46 provide latitude in laying out the wires 30 through 32 so that the wires 30 through 32 can be made shorter than otherwise, and can be laid without an undesirable wire flow at the time of the mold of the encapsulating resin 26.

Next, a description will be given below with respect to a third embodiment of the present invention.

Figure 16:
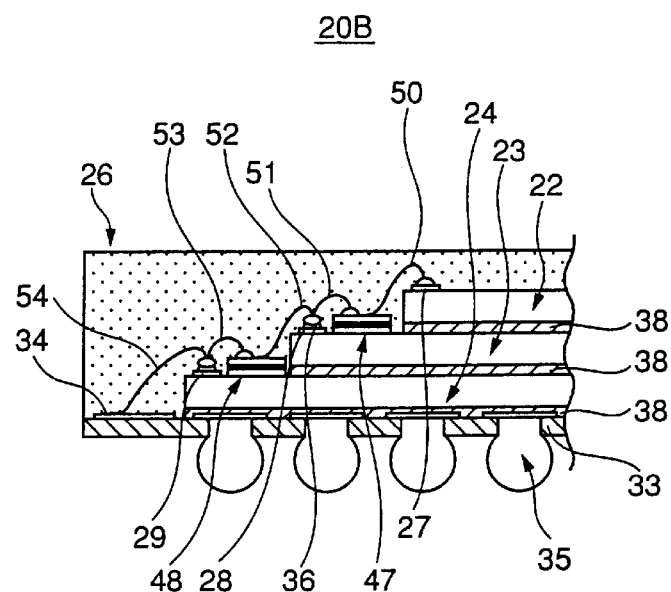
FIG. 16 is a cross-sectional view of a semiconductor device of a third embodiment according to the present invention.
Figure 17:
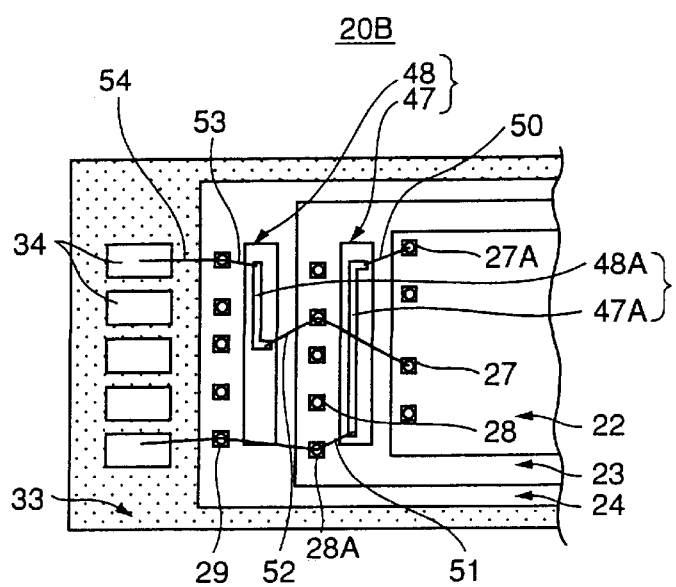
FIG. 17 is a plan view of the semiconductor device shown in FIG. 16, where encapsulating resin is partly removed.

FIGS. 16 and 17 show a semiconductor device 20B of the third embodiment according to the present invention. FIG. 16 is a cross-sectional view of the semiconductor device 20B and FIG. 17 is plan view of the same where the encapsulating resin 26 is removed in part.

The semiconductor device 20B in this embodiment is featured in that re-wiring layers 47 and 48 are provided on the second and third semiconductor elements 23 and 24, respectively. As seen from FIG. 17, the re-wiring layer 47 is provided approximately parallel to a row of the second electrodes 28 on a stepped portion formed by the first and second semiconductor elements 22 and 23, and the re-wiring layer 48 is provided approximately parallel to a row of the third electrodes 29 on a stepped portion formed by the second and third semiconductor elements 23 and 24.

In the third embodiment, the re-wiring layers 47 and 48 are formed as printed circuit substrates where re-wiring patterns 47A and 48A having predetermined patterns are formed thereon. Also, the re-wiring layers 47 and 48 are fixed on the second and third semiconductor elements 23 and 24 with adhesive.

Besides being formed as the printed circuit substrates, the re-wiring layers 47 and 48 may be formed as flexible printed substrates or the like, and may be integrally formed on the second and third semiconductor elements 23 and 24.

Thus, by providing the re-wiring layers 47 and 48 on the second and third semiconductor elements 23 and 24, first through fifth wires 50 through 54 can be prevented from crossing and generating a short circuit even if the electrodes 27 through 29 provided on the semiconductor elements 22 through 24 are laid out in a different way. With respect to this, a description will be given below.

In a case of connecting the stacked semiconductor elements 22 through 24, the wires 50 through 54 need to be laid between the electrodes which have the equal electrical properties and signal properties, namely, equi-electrodes. In a case where an electrode layout of the directly stacked first semiconductor element 22 is equal to that of the second semiconductor element 23 and the electrode layout of the second semiconductor element 23 is equal to that of the third semiconductor element 24, the wires 50 through 54 may be laid between the electrodes 27 through 29, straight without crossing (see FIGS. 6 and 7).

However, in a case where the electrode layouts of the semiconductor elements are different from each other, the equi-electrodes 27 through 29 are not arranged in corresponding positions on the semiconductor elements, and the wires need to be laid between those equi-electrodes. For this reason, the laying of these wires becomes difficult. In particular, if the wires are laid with high-density, they may contact each other, but avoiding the contact thereof may require increasing the size of the semiconductor device.

In contrast, in the third embodiment, by providing the re-wiring layers 47 and 48, which have the predetermined re-wiring patterns 47A and 48A, on the semiconductor elements 23 and 24, the wires 50 through 54 are, via the re-wiring layers 47 and 48, electrically connected among the first through third semiconductor elements 22 and 24 and between the third semiconductor element 24 and the substrate 33.

Specifically, as shown in FIG. 17, a first electrode 27A, which is the uppermost one on the semiconductor element 22, and a second electrode 28A, which is the lowermost one on the semiconductor element 23, are equi-electrodes and therefore need to be wire-connected. In a case of connecting the electrodes 27A and 28A directly via a wire, the wire has to be diagonally laid and may contact other wires provided thereon. Also, since the length of the diagonally laid wire is increased, the electrical properties thereof may be degraded.

Accordingly, in the third embodiment, without directly connecting the first electrode 27A and the second electrode 28A, first, the first electrode 27A is connected to the re-wiring layer 47 via the first wire 50.

The re-wiring layer 47 has the re-wiring pattern 47A which is approximately parallel to the rows of electrodes 27 and 28. The first wire 50 is laid between an upper end of the re-wiring pattern 47A and the first electrode 27A and the second wire 51 is laid between a lower end of the re-wiring pattern 47A and the second electrode 28A.

Thus, the first and second wires 50 and 51 do not interfere with other wires and are laid with shortened lengths. In addition, other wires may form wire loops over the re-wiring layer 47.

By providing the re-wiring layers 47 and 48, the wires 50 through 54 are prevented from crossing and thereby generating a short circuit. Also, it is possible that combinations of the semiconductor elements 22 through 24 will not be restricted by the electrode layouts. Also, the wires are shortened and thereby the electrical properties of the semiconductor device 20B can be improved.

Next, a description will be given below with respect to a fourth embodiment of the present invention.

Figure 18:
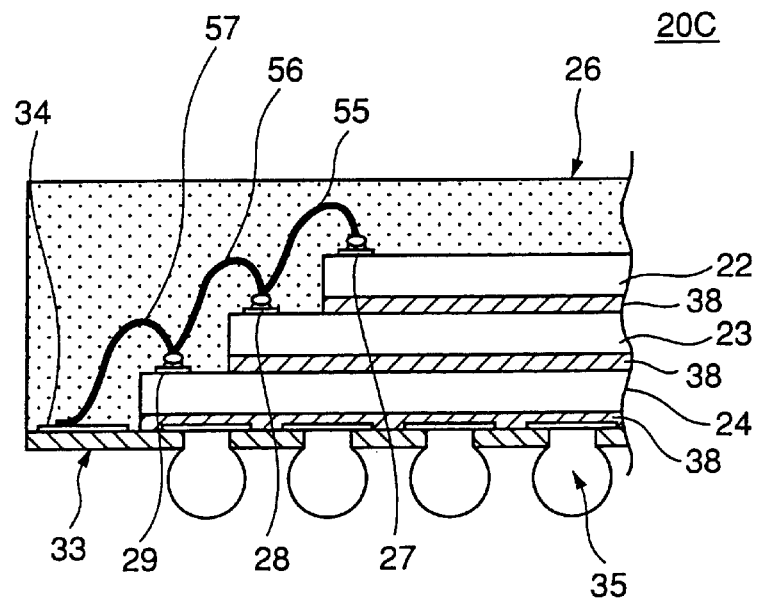
FIG. 18 is a cross-sectional view of a semiconductor device of a fourth embodiment according to the present invention.

FIG. 18 is a cross-sectional view showing a semiconductor device 20C of the fourth embodiment. The semiconductor device 20C is featured in that first through third wires 55 through 57 are thicker than the wires 30 through 32 in diameter.

Specifically, the diameter of each of the wires 30 through 32, which are used in the previously described embodiments, is approximately 25 $\mu$m, but in this embodiment, the diameter of the wires 55 through 57 ranges between 50 $\mu$m and 150 $\mu$m. Accordingly, inductance of the wires 55 through 57 can be reduced and thereby high-frequency properties thereof can be improved.

Figure 19:
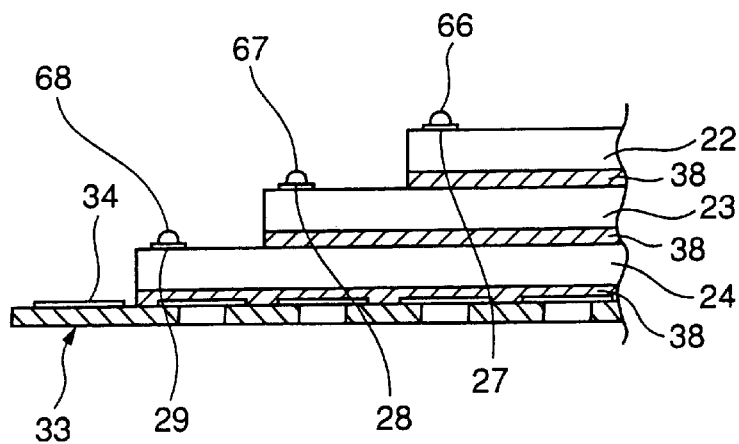
FIG. 19 is a diagram illustrating a bonding process in a method for producing the semiconductor device of the fourth embodiment according to the present invention.
Figure 20:
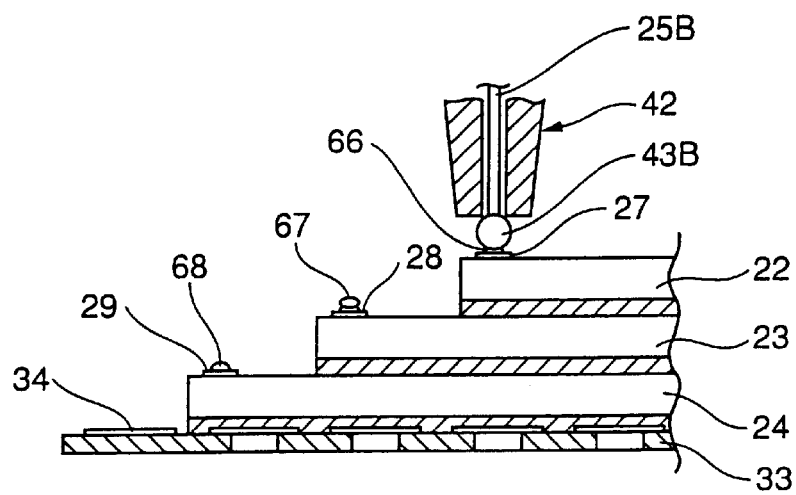
FIG. 20 is a diagram illustrating another bonding process in the method for producing the semiconductor device of the fourth embodiment according to the present invention.

FIGS. 19 and 20 illustrates a wire bonding process for laying the first through third wires 55 through 57 as a part of a method for producing the semiconductor device 20C. Next, a description will be given below in respect of the wire bonding process. In addition, parts, which are the same as those in FIGS. 8 to 14, are given the same reference numerals.

FIG. 19 shows a state prior to the bonding of the first through third wires 55 through 57. In this embodiment, the stud-bump forming process is also performed before the wire bonding process.

The stud-bump forming process performed in this embodiment is featured in that first through third stud bumps 66 through 68 are formed correspondingly to all of the electrodes 27 through 29 provided on the first through third semiconductor elements 22 through 24. That is, in this embodiment, the stud bump 66 is formed corresponding to the electrode 27 of the first semiconductor element 22.

The first through third stud bumps 66 through 68, which serve as the spacer members the same as the previously described first and second stud bumps 36 and 37, are formed by the wire bonding device used in the wire bonding of the first through third wires 55 through 57. The fine metal line 25A, which has a diameter of 25 $\mu$m less than that of the wires 55 through 57, is also used in this embodiment for forming the stud bumps 66 through 68.

The wire bonding device can use either the fine metal line 25A with the diameter of 25 $\mu$m for forming the stud bumps 66 through 68 or the fine metal line 25B with a diameter ranging from 50 $\mu$m to 150 $\mu$m for forming the wires 55 through 57. Accordingly, both the first through third stud bumps 66 through 68 and the first through third wires 55 through 57 are formed by using only one device. As a result, no additional equipment is needed to form the stud bumps 66 through 68 in this embodiment and thereby the production cost of the semiconductor device 20C is not increased.

FIG. 20 shows a first bonding state of the fine metal line 25B being joined to the first electrode 27 of the first semiconductor element 22. In this embodiment, since the fine metal line 25B having the diameter of 50 $\mu$m to 150 $\mu$m is relatively thick, a ball portion 43B formed on an end thereof becomes relatively large.

The capillary 42 presses the ball portion 43B upon the first stud bump 66 previously formed on the electrode 27 and at the same time is ultrasonically vibrated, so that the ball portion 43B is ultrasonically welded on the first stud bump 66. Since the junction of the fine metal line 25B is the first bonding, a first NHB portion 63B is formed on the first stud bump 66. At this time, although the first stud bump 66 is somewhat deformed by the pressing of the capillary 42, a predetermined height D3 shown by an arrow in FIG. 24 is maintained.

After the fine metal line 25B is joined to the first electrode 27 via the first stud bump 66, the capillary drags the fine metal line 25B and moves it to a place where the second electrode 28 of the second semiconductor element 23 is formed. Then, the capillary 42 presses the fine metal line 25B upon the second stud bump 67 formed on the second electrode 28 and, at the same time performs an ultrasonic weld with the ultrasonic vibration (the second bonding).

Figure 21:
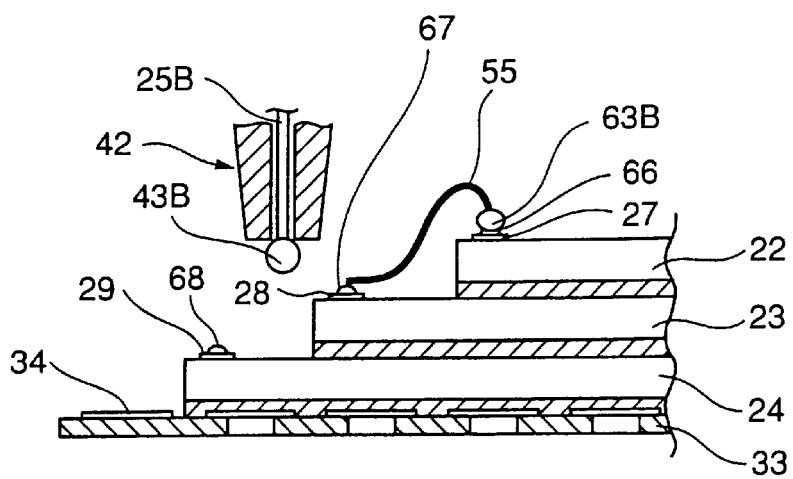
FIG. 21 is a diagram illustrating still another bonding process in the method for producing the semiconductor device of the fourth embodiment according to the present invention.
Figure 24:
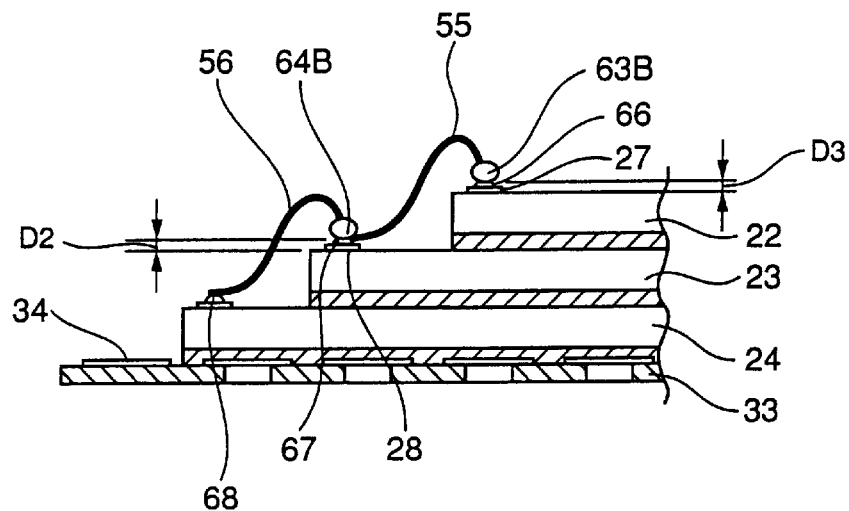
FIG. 24 is a diagram illustrating effects of the semiconductor device of the fourth embodiment according to the present invention.

Thus, although the second stud bump 67 is somewhat deformed by the pressing of the capillary 42, a predetermined height D2 shown by an arrow in FIG. 24 is maintained. Accordingly, as shown in FIG. 21, the first wire 55 is laid between the first electrode 27 and the second electrode 28.

As previously described, after the first wire 55 is thus laid, the second wire 56 is laid such that the capillary 42 is moved to a place where the second stud bump 67 is formed so that the capillary 42 can press the ball portion 43B upon the second stud bump 67 and at the same time is ultrasonically vibrated.

Figure 22:
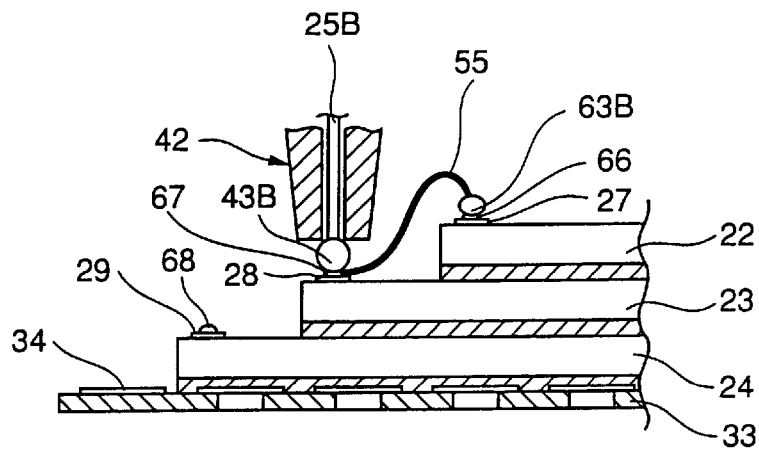
FIG. 22 is a diagram illustrating still another bonding process in the method for producing the semiconductor device of the fourth embodiment according to the present invention.

As shown in FIG. 22, the fine metal line 25B is ultrasonically welded on the second stud bump 67. Since the junction of the fine metal line 25B thereto is the first bonding, a second NHB portion 64B is formed on the second stud bump 67.

After the fine metal line 25B is joined to the second stud bump 67, the capillary 42 pushes out the fine metal line 25B therefrom and moves it to a place where the third electrode 29 of the third semiconductor element 24 is formed. Then, the capillary 42 presses the fine metal line 25B upon the third stud bump 68 formed on the third electrode 29 so as to perform the ultrasonic weld (the second bonding).

Figure 23:
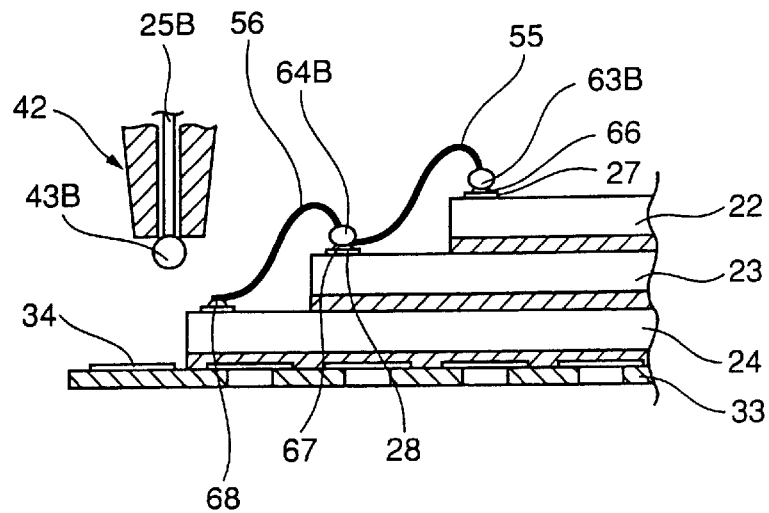
FIG. 23 is a diagram illustrating still another bonding process in the method for producing the semiconductor device of the fourth embodiment according to the present invention.

Thus, although the second stud bump 67 is also somewhat deformed by the pressing of the capillary 42, the predetermined height D2 is maintained. Accordingly, as shown in FIG. 23, the second wire 56 is laid between the second electrode 28 and the third electrode 29. Similarly, by performing the previously described process, the third wire 57 is laid between the third electrode 29 and the bonding pad 34 of the substrate 33.

Accordingly, in the fourth embodiment, by providing the first through third stud bumps 66 through 68, the first through third wires 55 through 57 can be separated from the semiconductor elements 22 through 24. As a result, there is no short-circuit in the circuits formed by the wires 55 through 57 within the semiconductor elements 22 through 24 and the reliability of the semiconductor device 20C can be improved.

Figure 25:
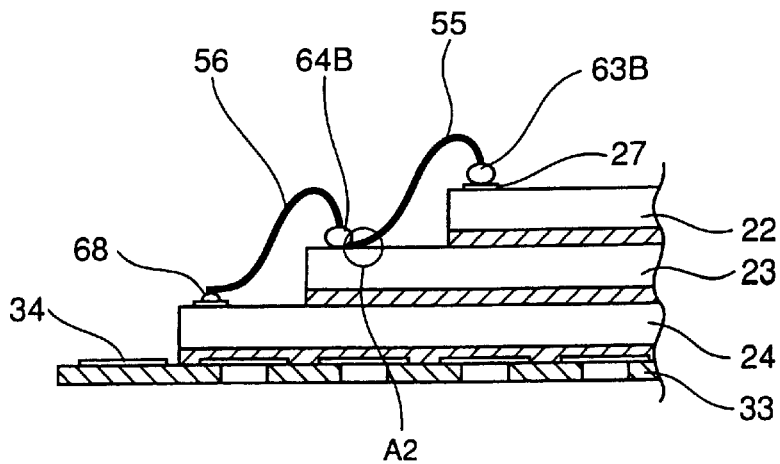
FIG. 25 is a diagram illustrating a problem generated when wires are directly bonded to electrodes of the semiconductor device of the fourth embodiment according to the present invention.

Also, as previously described, since the fine metal line 25B is thick, the NHB portions 63B, 64B and 65B formed during the first bonding of the fine metal line 25B become large. Accordingly, in a case where the stud bumps 66 through 68 are not provided, as shown by an arrow A2 in FIG. 25, the NHB portions 63B, 64B and 65B may spill out of the electrodes 27 through 29 and contact electrodes adjacent thereto or into the circuits formed in the semiconductor elements 22 through 24. FIG. 25 shows an example of the expansion of just the second NHB portion 64B.

However, in this embodiment, since the stud bumps having the predetermined heights are provided between the NHB portions 63B to 65B and the electrodes 27 through 29, the NHB portions 63B to 65B can be prevented from spilling out of the electrodes 27 through 29. In this embodiment, fine metal lines that are sufficiently thin are used for forming the stud bumps 66 through 68, ensuring that the metal does not spill out of the electrodes 27 through 29.

Also, even during a process of connecting the first wire 55 to the first electrode 27, it is possible for the first NHB portion 63B to stick out of the first electrode 27. For this reason, in this embodiment, the stud bump 66 is also formed on the first electrode 27.

The above description is provided in order to enable any person skilled in the art to make and use the invention and sets forth the best mode contemplated by the inventors for carrying out their invention.

Although the present invention has been described in terms of various embodiments, it is not intended that the invention be limited to these embodiments. Modification within the spirit of the invention will be apparent to those skilled in the art. For example, the number of the semiconductor elements is not limited to three. The semiconductor devices are not limited to the BGA type and can be any other semiconductor devices which are the stack type and use wires to connect semiconductor elements provided therein.

The present application is based on Japanese priority application No. 11-297410 filed on Oct. 19, 1999, the entire contents of which are hereby incorporated by reference.

What is claimed is:

1. A semiconductor device comprising:

a plurality of semiconductor elements, at least including an uppermost one, a middle one, and a lowermost one, which are stacked on a substrate;

a plurality of wires, each being electrically connected between two of electrodes, respectively provided on two of the semiconductor elements, or between two of electrodes, respectively provided on said substrate and said lowermost semiconductor element which is directly stacked on said substrate; and a plurality of spacer members, respectively provided between said wires and said electrodes provided on the semiconductor elements other than said uppermost one; wherein space is formed between said wires and the plurality of semiconductor elements by said spacer members, without contact therebetween.

2. The semiconductor device as claimed in claim 1, wherein said spacer members are stud bumps.

3. The semiconductor device as claimed in claim 1, wherein the plurality of semiconductor elements are provided with a plurality of re-wiring layers each having a predetermined re-wiring pattern, via the plurality of re-wiring layers, said wires being electrically connected between said two semiconductor elements and between the lowermost semiconductor element and the substrate.

4. The semiconductor device as claimed in claim 2, wherein each of said wires is larger in diameter than a wire used for forming said stud bumps.

5. The semiconductor device as claimed in claim 1, wherein said semiconductor elements have dummy pads which are electrically disconnected from circuits formed therewithin.

6. A semiconductor device comprising:

a plurality of semiconductor elements, at least including an uppermost one, a middle one, and a lowermost one, which are stacked on a substrate;

a plurality of wires, each being electrically connected between two of electrodes, respectively provided on two of the semiconductor elements, or between two of electrodes, respectively provided on said substrate and said lowermost semiconductor element which is directly stacked on said substrate; and a plurality of re-wiring layers each having a predetermined re-wiring pattern, said wires being electrically connected, via the plurality of re-wiring layers, between said two semiconductor elements and between the lowermost semiconductor element and the substrate.

* * * * *